United States Patent [19]
Linliu et al.

[11] Patent Number: 6,136,646
[45] Date of Patent: Oct. 24, 2000

[54] METHOD FOR MANUFACTURING DRAM CAPACITOR

[75] Inventors: Kung Linliu; Wan-Yih Lien, both of Hsinchu, Taiwan

[73] Assignee: Worldwide Semiconductor Manufacturing Corp, Hsinchu, Taiwan

[21] Appl. No.: 09/328,755

[22] Filed: Jun. 9, 1999

[30]     Foreign Application Priority Data

May 21, 1999 [TW] Taiwan ................................ 88108358

[51] Int. Cl.$^7$ ............................................. H01L 21/8242
[52] U.S. Cl. ........................................... 438/255; 438/595
[58] Field of Search ................................... 438/253, 255, 438/256, 396, 398, 399, 595, 596

[56]            References Cited

U.S. PATENT DOCUMENTS

| 5,763,286 | 6/1998 | Figura et al. | 438/255 |
| 5,960,294 | 9/1998 | Zahurak et al. | 438/255 |
| 5,981,333 | 6/1998 | Parekh et al. | 438/255 |

*Primary Examiner*—Chandra Chaudhari
*Attorney, Agent, or Firm*—J. C. Patents; Jiawei Huang

[57]            ABSTRACT

A method for manufacturing dynamic random access memory (DRAM) capacitor. A first insulation layer having a plurality of first plugs and second plugs therein is formed over a substrate. A plurality of bit lines is formed over the first insulation layer. Each bit line has a multiple of bit line contacts, and each bit line contact is connected electrically to one of the first plugs. A cap layer is formed on top of the bit lines and spacers are formed on the sidewalls of the bit lines. The spacers are formed in such a way that they are linked near the bit line contact of every pair of neighboring bit lines. A planarized second insulation layer is formed over the substrate. Using the cap layers, the spacers and the second plugs as stopping points, an etching operation is carried out to form the lower electrode openings of capacitors and node contact openings. A conformal conductive layer that covers the exposed surfaces of the electrode openings and the node contact openings are formed, hence forming the lower electrode of a capacitor. A dielectric layer is formed over the lower electrode, and finally an upper electrode is formed over the dielectric layer to form a complete capacitor.

14 Claims, 4 Drawing Sheets

METHOD FOR MANUFACTURING DRAM CAPACITOR

CROSS-REFERENCE TO RELATED APPLICATION

This application claims the priority benefit of Taiwan application serial no. 8108358, filed May 21, 1999, the full disclosure of which is incorporated herein by reference.

BACKGROUND OF THE INVENTION

1. Field of Invention

The present invention relates to a method for manufacturing dynamic random access memory (DRAM). More particularly, the present invention relates to a method for manufacturing DRAM capacitor.

2. Description of Related Art

As semiconductor manufacturing passes into the deep submicron scale, dimensions of each device shrink. Hence, a higher operating speed for each integrated circuit results. For an integrated circuit with the same device layout, operating speed is closely related to density of the devices. In a high-density integrated circuit such as DRAM, distance of separation between a node contact of the capacitor and its neighboring bit lines is correspondingly reduced. Therefore, how to maintain good isolation between the node contact and bit lines despite their increasing closeness is a major problem waiting to be resolved.

To maintain good isolation between a node contact and a bit line, DRAM capacitors are conventionally formed by a polysilicon-spacer reduced contact method or a self-aligned contact (SAC) method is used. What the polysilicon-spacer reduced contact method aims for is a reduction of the dimensions of a node contact so that thickness of an insulation layer between the node contact and the neighboring bit lines is increased. The method involves forming a polysilicon layer over an insulation layer and forming an opening of designated dimensions in the polysilicon layer. This is followed by forming polysilicon spacers on the sidewalls of the opening, thereby reducing size of the opening. Using the polysilicon layer and the polysilicon spacers as a mask, the insulation layer is etched to form a smaller node contact opening. Through the reduction of node dimensions, subsequently formed node contact is further apart from adjacent bit lines by a thicker intervening insulation layer. Hence, a better insulation between the node contact and the bit line is achieved.

In the self-aligned contact method, silicon nitride cap layer and silicon nitride spacers are formed on respective top surface and sidewalls of a bit line so that the bit line is entirely enclosed. An insulation layer is formed over the bit lines and underlying substrate layer. The insulation layer is patterned so that a node contact opening is formed between two neighboring bit lines. Due to the presence of the silicon nitride layer around the bit lines, good insulation between the bit line and the node contact is ensured.

However, the two aforementioned methods manage to form node contact openings only. A photomask is still needed to pattern out a lower electrode with the desired shape at designated locations above the insulation layer. Since some more processing steps are required to complete the fabrication of the capacitor, more time is consumed and additional costs are incurred.

SUMMARY OF THE INVENTION

Accordingly, the present invention is to provide a method for manufacturing dynamic random access memory (DRAM) capacitor such that spacers are linked at the bit line contact of every pair of neighboring bit lines. Therefore, underlying devices in areas outside the node contact opening are protected from the damaging action of etchants during a self-aligned etching operation. Secondly, only one photomask and one self-aligned etching operation are required to pattern out the node contact openings and the lower electrodes of the capacitor, therefore less processing steps are needed. Thirdly, the use of self-aligned etching process is capable of providing extra area for forming the capacitor. Hence, charge storage capacity of the capacitor is increased and the number of refreshes for operating DRAMs is lowered.

To achieve these and other advantages and in accordance with the purpose of the invention, as embodied and broadly described herein, the invention provides a method for manufacturing DRAM capacitor. First, a substrate is provided, and a plurality of gate terminals is formed above the substrate. A source terminal is formed in the substrate on one side of the gate terminal while a drain terminal is formed in the substrate on the other side of the gate terminal. A first insulation layer is formed over the substrate. A plurality of first plugs and second plugs are formed in the first insulation layer. Each first plug is electrically connected to the source region and each second plug is electrically connected to the drain region. A planarized second insulation layer is formed over the substrate. A multiple of openings each exposing a first plug is formed in the second insulation layer. A planarized first conductive layer is formed over the second insulation layer and completely filling the opening. A first buffer layer and a third insulation layer are sequentially formed above the first conductive layer. The third insulation layer, the first buffer layer and the first conductive layer are patterned to form a multiple of stacked bit lines. Each stacked bit line contains a number of bit line contacts with each bit line contact positioned above and electrically connected to one of the first plugs. A second buffer layer is formed over the sidewalls of the first conductive layer. Spacers are formed on the sidewalls of each stacked bit line such that the spacers around the bit line contact of every pair of neighboring bit lines are linked. A planarized fourth insulation layer is formed over the substrate. A portion of the fourth insulation layer and the second insulation layer are removed using the third insulation layer, the spacers and the second plug as stopping points. Hence, a plurality of node contact openings that expose the second plug is formed. A conformal second conductive layer and a dielectric layer are sequentially formed over the exposed surfaces of the node contact opening. A conformal third conductive layer is formed over the dielectric layer and around the node contact openings above the fourth insulation layer, thus completing the fabrication of the capacitor.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
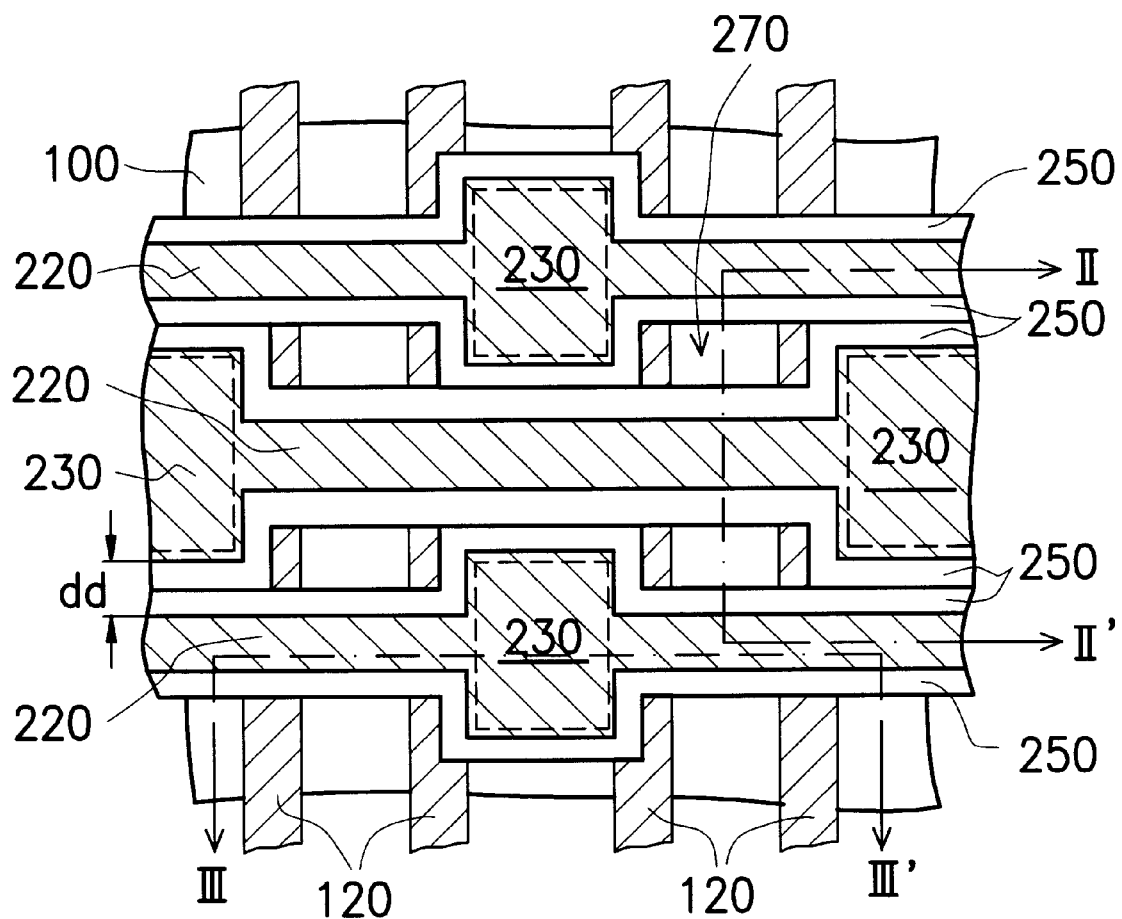
FIG. 1 is a top view showing a portion of the circuit layout of DRAM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1, 2A to 2D, 3A and 3B are diagrams illustrating in a step by step manner how the DRAM capacitor of this invention is manufactured. FIG. 1 is a top view showing a portion of the circuit layout of DRAM according to one preferred embodiment of this invention. FIGS. 2A through 2D are cross-sectional views along line II–II' of FIG. 1 showing the progression of steps in manufacturing a DRAM capacitor.

Figure 3A:
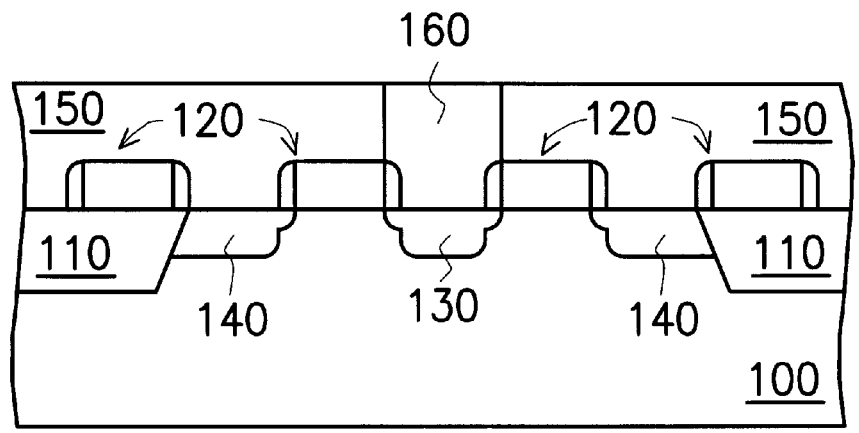
FIGS. 3A and 3B are cross-sectional views along line III–III' of FIG. 1 showing the progression of steps in manufacturing a DRAM capacitor.
Figure 3B:
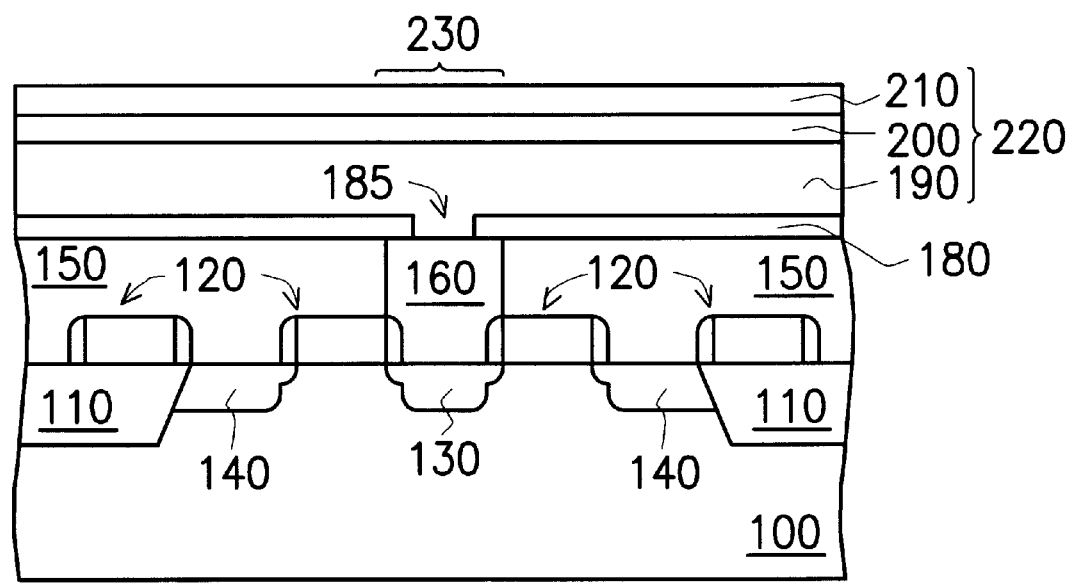

FIGS. 3A and 3B are cross-sectional views along line III–III' of FIG. 1 showing the progression of steps in manufacturing a DRAM capacitor.

As shown in FIG. 1, a number of parallel gate lines 120, also referred to as word lines, are placed above a substrate 100. A plurality of bit lines 220 substantially parallel to each other but substantially perpendicular to the gate lines 120 is formed on op of the gate lines 120. The bit lines 220 has a multiple of bit line contacts 230 each electrically coupled to a source terminal 130 (refer to FIGS. 3A and 3B) of a transistor. Surrounding the bit line stack 220 are spacers 250. The spacers 250 and a subsequently formed insulation layer 260 (refer to FIGS. 2C and 2D) are made from materials having considerable etching selectivity that facilitates self-aligned etching process.

One important aspect of this invention is to increase the dimensions of bit line contacts 230. Hence, distance of separation between the bit line contact 230 and its adjacent bit line 220 is smaller than twice the width of spacers 250. This arrangement is able to prevent damages of underlying devices or circuits outside the node contact opening 270 regions when regions 270 are formed by etching.

Figure 2A:
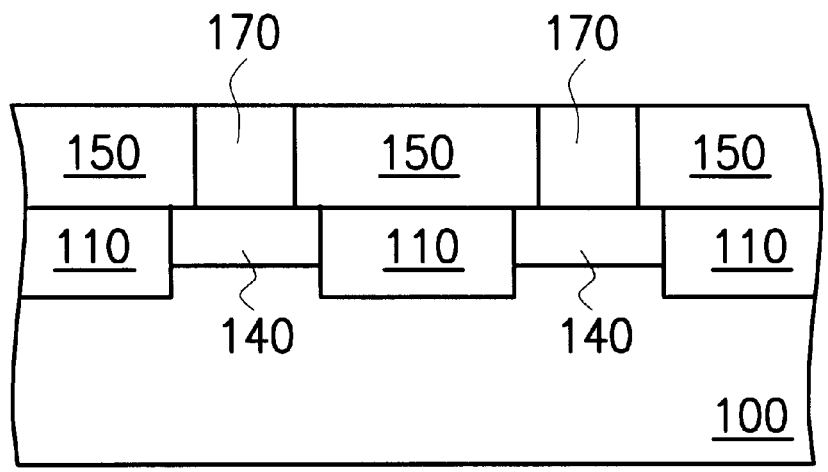
FIGS. 2A through 2D are cross-sectional views along line II–II' of FIG. 1 showing the progression of steps in manufacturing a DRAM capacitor.

The steps for forming a DRAM capacitor of this invention can best be illustrated by looking at a series of cross-sectional views along line II–II' and III–III' of FIG. 1. As shown in FIGS. 2A and 3A, a substrate 100 having a device isolation structure 110 thereon is provided. Gate terminals 120 are formed above the substrate 100. There is a source terminal 130 in the substrate 100 on one side of the gate terminal 120 and a drain terminal 140 in the substrate 100 on the other side of the gate terminal 120. A first insulation layer 150 is formed over the substrate 100. The first insulation layer has a first plug 160 and a second plug 170 as well. The first plug 160 is electrically connected to the source terminal 130 while the second plug 170 is electrically connected to the drain terminal 140.

The first insulation layer 150 can be made from material such as silicon oxide or undoped silicon glass (USG). The first insulation layer 150, for example, is formed by performing low-pressure chemical vapor deposition (LPCVD) process, plasma-enhanced chemical vapor deposition (PECVD) or high-density plasma chemical vapor deposition (HDPCVD). Both the first plug 160 and the second plug 170 can be made from material such as doped polysilicon or tungsten and formed by performing a low-pressure chemical vapor deposition (LPCVD).

Figure 2B:
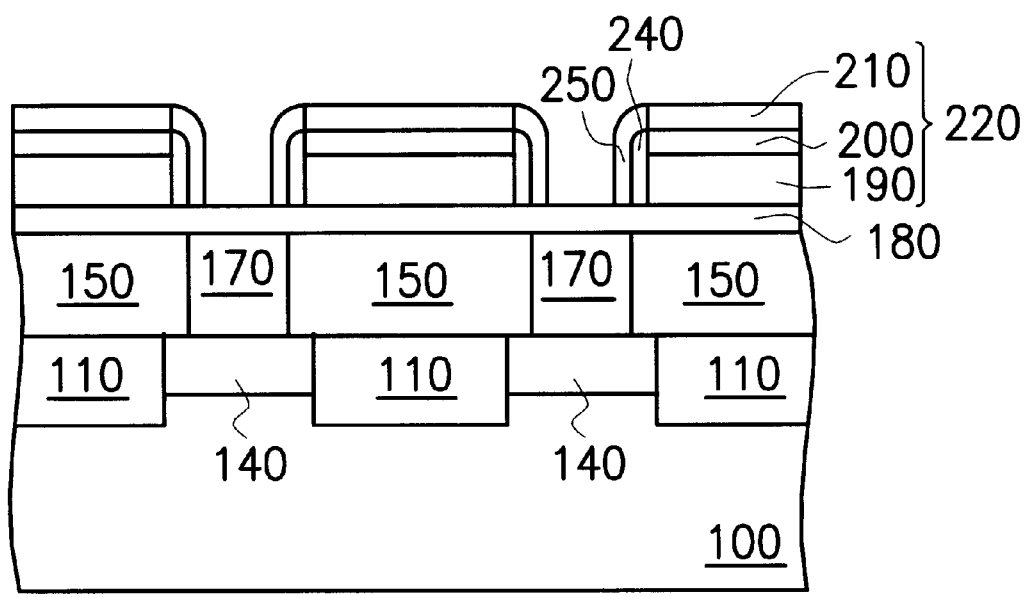

As shown in FIGS. 2B and 3B, a second insulation layer 180 is formed over the substrate 100. An opening 185 that exposes a portion of the first plug 160 is formed in the second insulation layer 180. The second insulation layer can be made from material such as silicon oxide and formed by performing plasma-enhanced chemical vapor deposition (PECVD), for example. The opening 185 can be formed, for example, by carrying out photolithographic and etching processes.

A planarized first conductive layer 190 that also fills the opening 185 is formed over the second insulation layer 180. The first conductive layer 190, for example, can be a doped polysilicon layer formed using a chemical vapor deposition (CVD) method.

A first buffer layer 200 is formed over the first conductive layer 190. The first buffer layer 200 preferably a silicon oxide layer having a thickness of between 100 Å to 200 Å is formed using a chemical vapor deposition (CVD) method, for example. In fact, the first buffer layer 200 is preferably formed using a material able to produce only a small thermal stress to the first conductive layer 190.

A third insulation layer 210 is formed over the buffer layer 200. The third insulation layer 210 is preferably a silicon nitride layer formed using a chemical vapor deposition (CVD) method, for example. The third insulation layer 210, the first buffer layer 200 and the first conductive layer 190 are patterned to form a multiple of stacked bit lines 220. Each stacked bit line 220 has a multiple of bit line contacts 230 each having a width greater than the width of the bit line 220 itself. Each bit line contact 230 is located above and electrically connected to one of the first plugs 160.

A second buffer layer 240 is formed on the sidewalls of the first conductive layer 190. The second buffer layer 240 can be a silicon oxide spacer or a silicon oxide layer formed by direct thermal oxidation of the sidewalls of the first conductive layer 190. The second buffer layer 240 having a thickness of between 100 Å to 200 Å is preferably formed using a material that forms little thermal stress with the first conductive layer 190.

Spacers 250 are formed on the sidewalls of the stacked bit lines 220. The spacers 250 lying between the bit line contact 230 and its adjacent stacked bit line 230 are linked and so the devices under the spacers 250 are protected. The spacers 250 can be formed using a material having properties very similar to the third insulation layer 210 such as silicon nitride.

Sections along line III–III' of FIG. 1 are related to the fabrication of the stacked bit lines 220 while sections along line II–II' of FIG. 1 are related to the fabrication of the entire capacitor. Hence, the following description refers to sections along II–II' of FIG. 1.

Figure 2C:
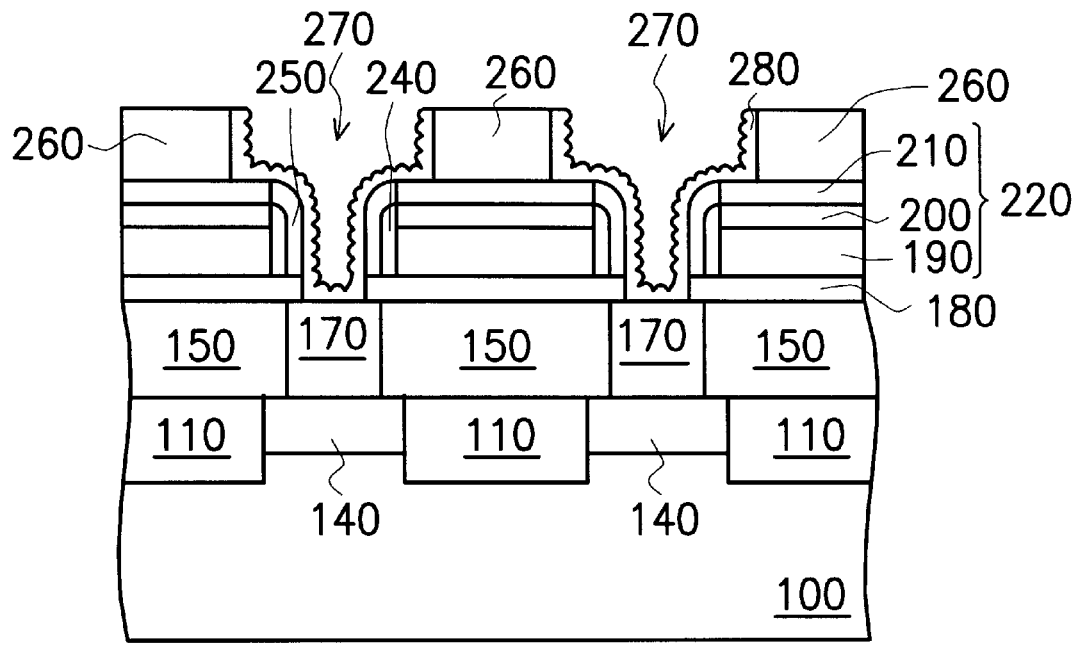

As shown in FIG. 2C, a planarized fourth insulation layer 260 is formed over the substrate 100. A portion of the fourth insulation layer 260 and the second insulation layer 180 are removed using the third insulation layer 210, the spacers 250 and the second plug 170 as the stopping points. Hence, node contact openings 270 that expose the second plug 170 are formed. The fourth insulation layer 260 is formed preferably using a material having properties very similar to the second insulation layer 180. Moreover, the fourth insulation layer 260 should have an etching selectivity quite different from the third insulation layer 210, the spacers 250 and the second plug 170. If both the third insulation layer 210 and the spacers 250 are made from silicon nitride while the second plug 170 is made from doped polysilicon or tungsten, for example, both the fourth insulation layer 260 and the second insulation layer 180 can be a silicon oxide layer.

A conformal second conductive layer 280 is formed covering the bottom and sidewalls of the node contact opening 270. The second conductive layer 280 serves as a lower electrode of a capacitor as well as a node contact plug. The second conductive layer 280 can be a doped polysilicon layer having hemispherical grained silicon (HSG) on its surface. The second conductive layer 280 is formed by depositing conductive material into the node contact opening 270 and over the fourth insulation layer 260. Material in the second conductive layer lying above the fourth insulation layer 260 are removed by performing, for example, a chemical-mechanical polishing (CMP) operation.

Figure 2D:
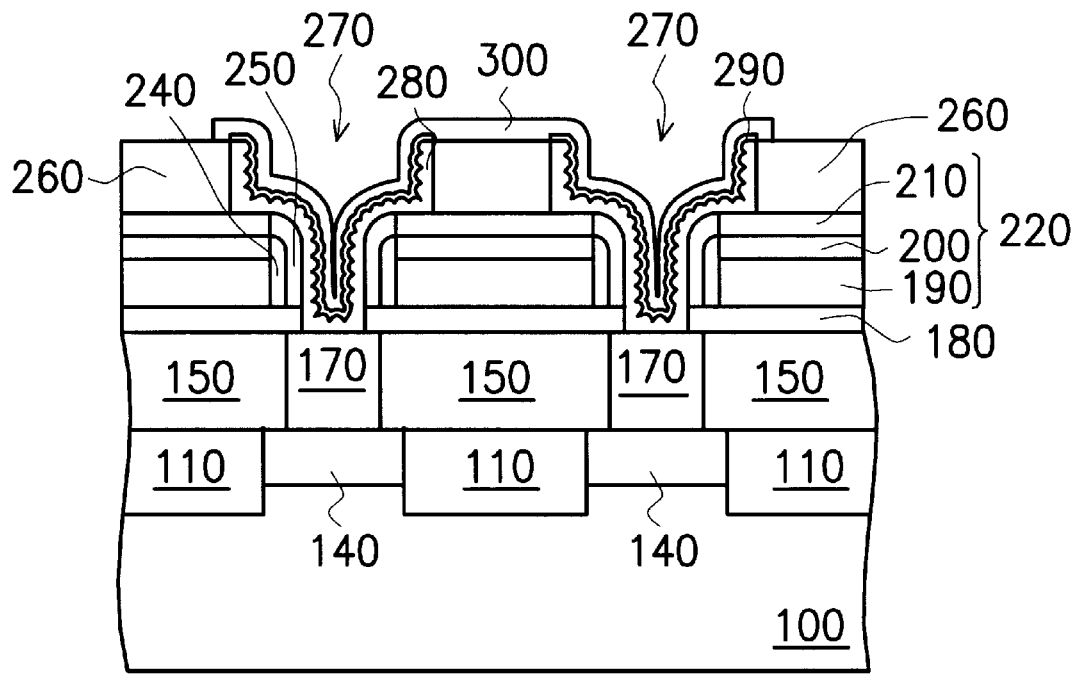

As shown in FIG. 2D, a dielectric layer 290 is formed over the second conductive layer 280. The dielectric layer 290 can be an oxide/nitride/oxide (ONO) composite layer. A conformal third conductive layer 300 above the fourth insulation layer 260 surrounding the dielectric layer 290 and the node contact openings 270. The third conductive layer 300 can be a doped polysilicon layer formed using a chemical vapor deposition (CVD) method, for example.

In summary, the advantages of using the method of this invention to form DRAM capacitor includes:

1. Spacers are linked near the bit line contact of every pair of neighboring bit lines. Therefore, underlying devices in areas outside the node contact opening are protected from the damaging action of etchants during a self-aligned etching operation.

2. Only one photomask and one self-aligned etching operation are required to pattern out the node contact openings and the lower electrodes of a capacitor. Hence, less processing steps are needed.

3. The use of self-aligned etching process is capable of providing extra area for forming the capacitor. Hence, charge storage capacity of the capacitor is increased and the number of refreshes necessary for operating the DRAMs is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing dynamic random access memory (DRAM) capacitor, comprising the steps of:

providing a substrate having a plurality of gate terminals thereon, a source region in the substrate on one side of the gate terminal and a drain region in the substrate on the other side of the gate terminal, a first insulation layer having a plurality of first plugs and a plurality of second plugs above the substrate, and each first plug is electrically connected to one of the source regions while each second plug is electrically connected to one of the drain regions;

forming a second insulation layer over the substrate;

forming a plurality of openings in the second insulation layer, each of the opening exposing the first plug;

forming a planarized first conductive layer that fills the openings and covers the second insulation layer;

forming a first buffer layer over the first conductive layer;

forming a third insulation layer over the buffer layer;

patterning the third insulation layer, the first buffer layer and the first conductive layer to form a plurality of stacked bit lines, each stacked bit line further includes a plurality of bit line contact located above and electrically connected to the first plug;

forming a second buffer layer over the sidewalls of the first conductive layer;

forming spacers on the sidewalls of the stacked bit lines such that spacers near the bit line contact of every pair of neighboring bit lines are linked;

forming a planarized fourth insulation layer over the substrate;

removing a portion of the fourth insulation layer and the second insulation layer to form a plurality of node contact openings that expose the respective second plugs, using third insulation layer, the spacers and the second plugs as stopping points;

forming a conformal second insulation layer over the fourth insulation layer and the interior sidewalls of the node contact openings;

removing a top layer of the second conductive layer lying above the fourth insulation layer;

forming a dielectric layer over the second conductive layer; and forming a conformal third conductive layer over the dielectric layer and around the node contact openings above the fourth insulation layer.

2. The method of claim 1, wherein the step of forming the first conductive layer includes depositing doped polysilicon by performing a chemical vapor deposition.

3. The method of claim 1, wherein the step of forming the second insulation layer includes depositing silicon oxide by performing a chemical vapor deposition.

4. The method of claim 1, wherein the step of forming the first buffer layer includes depositing silicon oxide performing a chemical vapor deposition.

5. The method of claim 1, wherein the step of forming the second buffer layer includes depositing silicon oxide by performing a thermal oxidation.

6. The method of claim 1, wherein the step of forming the second buffer layer includes depositing silicon oxide to form a silicon oxide spacer.

7. The method of claim 1, wherein the step of forming the spacers includes depositing silicon nitride.

8. The method of claim 1, wherein the step of forming the third insulation layer includes depositing silicon nitride by performing a chemical vapor deposition.

9. The method of claim 1, wherein the step of forming the fourth insulation layer includes depositing silicon oxide by performing a chemical vapor deposition.

10. The method of claim 1, wherein the step of forming the second conductive layer includes depositing doped polysilicon by performing a chemical vapor deposition.

11. The method of claim 1, wherein the step of forming the dielectric layer includes depositing silicon oxide, silicon nitride and silicon oxide in sequence to form an oxide/nitride/oxide composite layer.

12. The method of claim 1, wherein the step of forming the third conductive layer includes depositing doped polysilicon by performing a chemical vapor deposition.

13. A method for manufacturing the lower electrode of a dynamic random access memory (DRAM) capacitor, comprising the steps of:

providing a substrate having a plurality of gate terminals thereon, a source region in the substrate on one side of the gate terminal and a drain region in the substrate on the other side of the gate terminal, a first insulation layer having a plurality of first plugs and a plurality of second plugs above the substrate, and each first plug is electrically connected to one of the source regions while each second plug is electrically connected to one of the drain regions;

forming a second insulation layer over the substrate;

forming a plurality of openings in the second insulation layer, each of the opening exposing the first plug;

forming a plurality of stacked bit lines, each stacked bit line is composed of a first conductive layer and a third insulation layer above, each stack bit line also has a plurality of bit line contacts located above and electrically connected to the first plug;

forming spacers on the sidewalls of the stacked bit lines such that spacers are linked near the bit line contact of every pair of neighboring bit lines;

forming a planarized fourth insulation layer over the substrate;

removing a portion of the fourth insulation layer and the second insulation layer to form a plurality of node contact openings that expose the respective second plugs, using third insulation layer, the spacers and the second plugs as stopping points; and forming a conformal second conductive layer over the interior sidewalls of the node contact openings.

14. A method for manufacturing the lower electrode of a dynamic random access memory (DRAM) capacitor, comprising the steps of:

providing a substrate having a plurality of gate terminals thereon, a source region in the substrate on one side of the gate terminal and a drain region in the substrate on the other side of the gate terminal, a first insulation layer having a plurality of first plugs and a plurality of second plugs above the substrate, and each first plug is electrically connected to one of the source regions while each second plug is electrically connected to one of the drain regions;

forming a plurality of bit lines above the first insulation layer, each bit line includes a plurality of bit line contacts with each bit line contact electrically connected with one of the first plugs;

forming a protective layer over and on the sidewalls of each bit line such that the protective layer is continuous near the bit line contact of every pair of neighboring bit lines;

forming a planarized second insulation layer over the substrate;

removing a portion of the second insulation layer to form a plurality of node contact openings that expose the second plug, using the protective layer and the second plug as stopping points; and forming a conformal second conductive layer over the interior sidewalls of the node contact openings.

* * * * *